US009722163B2

(12) United States Patent
Firdosy et al.

(10) Patent No.: US 9,722,163 B2
(45) Date of Patent: Aug. 1, 2017

(54) COMPLIANT INTERFACIAL LAYERS IN THERMOELECTRIC DEVICES

(71) Applicants: Samad A. Firdosy, La Crescenta, CA (US); Billy Chun-Yip Li, Walnut, CA (US); Vilupanur A. Ravi, Claremont, CA (US); Jean-Pierre Fleurial, Altadena, CA (US); Thierry Caillat, Pasadena, CA (US); Harut Anjunyan, Tujunga, CA (US)

(72) Inventors: Samad A. Firdosy, La Crescenta, CA (US); Billy Chun-Yip Li, Walnut, CA (US); Vilupanur A. Ravi, Claremont, CA (US); Jean-Pierre Fleurial, Altadena, CA (US); Thierry Caillat, Pasadena, CA (US); Harut Anjunyan, Tujunga, CA (US)

(73) Assignee: California Institute of Technology, Pasadena, CA (US)

( * ) Notice: Subject to any disclaimer, the term of this patent is extended or adjusted under 35 U.S.C. 154(b) by 696 days.

(21) Appl. No.: 13/913,233

(22) Filed: Jun. 7, 2013

(65) Prior Publication Data

US 2015/0357541 A1 Dec. 10, 2015

Related U.S. Application Data

(60) Provisional application No. 61/626,926, filed on Jun. 7, 2012, provisional application No. 61/775,221, filed on Mar. 8, 2013.

(51) Int. Cl.
*H01L 35/08* (2006.01)
*H01L 35/32* (2006.01)
(Continued)

(52) U.S. Cl.
CPC .............. *H01L 35/08* (2013.01); *H01L 35/20* (2013.01); *H01L 35/32* (2013.01); *H01L 35/34* (2013.01)

(58) Field of Classification Search
CPC ......... H01L 35/08; H01L 35/20; H01L 35/32; H01L 35/34
(Continued)

(56) References Cited

U.S. PATENT DOCUMENTS 3,822,152 A 7/1974 Kot
6,660,926 B2 12/2003 Fleurial et al.
(Continued)

OTHER PUBLICATIONS

Liu et al., "Properties of Closed-Cell Nickel-Graphite Composite," Metallurgical and Materials Transactions A, vol. 37, No. 9., Sep. 2006, pp. 2849-2858.
(Continued)

*Primary Examiner* — Susan D Leong
(74) *Attorney, Agent, or Firm* — Canady & Lortz LLP; Bradley K. Lortz

(57) ABSTRACT

A thermoelectric power generation device is disclosed using one or more mechanically compliant and thermally and electrically conductive layers at the thermoelectric material interfaces to accommodate high temperature differentials and stresses induced thereby. The compliant material may be metal foam or metal graphite composite (e.g. using nickel) and is particularly beneficial in high temperature thermoelectric generators employing Zintl thermoelectric materials. The compliant material may be disposed between the thermoelectric segments of the device or between a thermoelectric segment and the hot or cold side interconnect of the device.

17 Claims, 5 Drawing Sheets

(51) Int. Cl.
   *H01L 35/20* (2006.01)
   *H01L 35/34* (2006.01)

(58) Field of Classification Search
   USPC .................... 136/201, 205, 206, 237, 242
   See application file for complete search history.

(56) References Cited

U.S. PATENT DOCUMENTS

| | | | |
|---|---|---|---|
| 7,461,512 B2 | 12/2008 | Sakamoto et al. | |
| 2007/0095382 A1* | 5/2007 | Snyder | H01L 35/16 136/236.1 |
| 2010/0307551 A1 | 12/2010 | Ravi et al. | |
| 2012/0160293 A1* | 6/2012 | Jinushi | H01L 35/34 136/237 |
| 2013/0146116 A1* | 6/2013 | Jovovic | H01B 1/16 136/200 |
| 2013/0152990 A1* | 6/2013 | Lai | H01L 35/34 136/237 |

OTHER PUBLICATIONS

Ravi et al., "Thermal Expansion Studies of Selected High-Temperature Thermoelectric Materials," (2009) J. Elec Mat, vol. 38, No. 7, pp. 1433-42.

Ravi et al., °Mechanical Properties of Thermoelectric Skutterudites: 2008 Proceedings of Space Technology and Applications International Forum (STAIF-08), AIP Conference.

RCA, "Silicon Germanium Thermoelectric Materials and Module Development Program," ALO (2510)-T1, AEC Research and Development Rep, Cat. UC33, TID 4500, 1969.

Hendricks et al., "Engineering Scoping Study of Thermoelectric Generator Systems for Industrial Waste Heat Recovery," U.S. DOE, Nov. 2006.

Fleurial et al., "Skutterudites: An Update," Proceedings of the Xvi INT. Conf. on Thermoelectrics, Dresden Germany, Aug. 26-29, 1997.

Zybala et al., "Junctions and Diffusion Barriers for High Temperature Thermoelectric Modules," Ceramic Materials, 62, 4, 2010, 481485.

Zhao et al., "Interfacial Evolution . . . of CoSb3/Ti/Mo-Cu Thermoelectric Joints During Acclerated Thermal Aging," J. of Alloys and Compounds, 477 (2009), 425-431.

Wojciechowski et al., "High temperature CoSb3—Cu junctions," Microelectronics Reliability, vol. 51, Issue 7, Jun. 7, 2011.

deWinter et al., "The Design of a Nuclear Power Supply with a 50 Year Life Expectancy: The JPL Voyager's SiGe MHW RTG," IEEE AES Systems Magazine, Apr. 2000, pp. 5-12.

Rowe, "Recent Advances in Silicon-Germanium Alloy Technology and . . . ," Journal of Power Sources, 19 (1987), pp. 247-259.

Brown et al., "Yb14MnSb11: New High Efficiency Thermoelectric Materials for Power Generation," Chem. Mater., 18, 2006, 1873-1877.

* cited by examiner

COMPLIANT INTERFACIAL LAYERS IN THERMOELECTRIC DEVICES

CROSS-REFERENCE TO RELATED APPLICATIONS

This application claims the benefit under 35 U.S.C. §119(e) of the following U.S. provisional patent applications, which are incorporated by reference herein:

U.S. Provisional Patent Application No. 61/775,221, filed Mar. 8, 2013, and entitled "COMPLIANT INTERFACIAL LAYERS IN THERMOELECTRIC DEVICES", by Firdosy et al.; and U.S. Provisional Patent Application No. 61/626,926, filed Jun. 7, 2012, and entitled "NICKEL-GRAPHITE COMPOSITE COMPLIANT INTERFACE AND/OR HOT SHOE MATERIAL", by Firdosy et al.

STATEMENT OF GOVERNMENT RIGHTS

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to thermoelectric devices. Particularly, this invention relates to interfacing materials for thermoelectric materials in thermoelectric power generation devices, particularly those using Zintl, e.g. $Yb_{14}MnSb_{11}$ (YMS) and skutterudite.

2. Description of the Related Art

Thermoelectric materials exhibit the property of producing an electric voltage from an applied temperature differential across the material, the so-called thermoelectric effect or Seebeck effect. Accordingly, such materials may be used in thermoelectric devices to generate electrical power from a temperature differential. Such thermoelectric generators have been used to convert heat directly to electrical power for applications including isolated facilities or space applications. Depending upon the application, the applied heat may be naturally available or generated, e.g. by burning fuel or from a decaying radioisotope.

As mentioned, thermoelectric materials are known to provide a means for directly converting heat into electrical energy in a fully solid state device. Due to the nature of thermoelectric materials, power generating devices require a pairing of two different materials, typically comprised of highly doped narrow band gap semiconductors (one with an excess of n-type charge carriers, the other with an excess of p-type carriers) connected in a junction.

Prior art thermoelectric devices have featured materials such as silicon germanium, lead telluride, bismuth telluride or other related materials. To achieve greater device efficiency and greater specific power, however, new thermoelectric materials, are required in more complex combinations. One suitable material is found in the class of Zintl materials, particularly the compound p-type semiconductor $Yb_{14}MnSb_{11}$ (YMS), which has been demonstrated to have one of the highest zT values at 1000° C., a typical operational temperature of space-based radioisotope thermoelectric generators (RTGs).

For example, some thermoelectric power generation for deep space applications have employed SiGe thermoelectric materials generating electric power using a decaying radioisotope, e.g. plutonium 238, as a heat source, in an RTG. The fuel source and solid state nature of the devices afford exceptional service life and reliability, paramount considerations in space applications which offset the relatively low efficiency of such devices. Many working RTG devices for space applications have been developed and successfully employed. See e.g. Winter et al., "The Design of a Nuclear Power Supply with a 50 Year Life Expectancy: The JPL Voyager's SiGe MHW RTG," IEEE AES Systems Magazine, April 2000, pp. 5-12; and U.S. Pat. No. 3,822,152, issued Jul. 2, 1974 to Kot, which are incorporated by reference herein.

Recent focus on renewable energy and increased energy efficiency has resulted in increased interest in thermoelectric materials and devices for applications such as automotive and industrial waste heat recovery. Zintl materials in particular have been studied for thermoelectric applications. A particular Zintl compound, $Yb_{14}MnSb_{11}$, has shown exceptional promise for thermoelectric power generation applications. See e.g. Brown et al., "$Yb_{14}MnSb_{11}$: New High Efficiency Thermoelectric Materials for Power Generation," Chem. Mater., 18, 2006, 1873-1877, which is incorporated by reference herein. However, defining the properties of a particular material are only a first step in the development of a practical thermoelectric power generation device using that material.

SiGe has been well studied as a thermoelectric material as a result of previous RTG development. See e.g., Rowe, "Recent Advanced in Silicon-Germanium Alloy Technology and an Assessment of the Problems of Building the Modules for a Radioisotope Thermoelectric Generator," Journal of Power Sources, 19 (1987), pp. 247-259; and "Silicon Germanium Thermoelectric Materials and Module Development Program," ALO (2510)-T1, AEC Research and Development Rep, Cat. UC33, TID 4500, which are incorporated by reference herein. However, although the general configurations of previously developed SiGe thermoelectric power generation devices may be applicable, there are differences in the physical properties of Zintl materials and SiGe that demand new solutions in the development of a practical thermoelectric power generation devices using Zintl materials; the solutions for SiGe thermoelectric materials cannot be readily applied to Zintl thermoelectric materials.

To achieve high thermal-to-electric energy conversion efficiency ("Carnot" efficiency) operating across large temperature differentials is required. When using solid state thermoelectric devices for power generation using high grade heat sources, best conversion efficiencies are achieved by combining the highest performance materials in their respective optimum operating temperature ranges into multi-stage cascaded or segmented device architectures. Such segmented architectures have been used primarily for long life thermoelectric generators on board space science and exploration missions, operating across temperature differentials in excess of 700 K with maximum hot side operating temperatures of up to 1273 K.

Next generation high temperature thermoelectric power generating devices will employ segmented architectures and will have to reliably withstand thermally induced mechanical stresses produced during component fabrication, device assembly and operation. Thermoelectric materials have typically poor mechanical strength, can exhibit brittle behavior, and possess a wide range of coefficient of thermal expansion (CTE) values. As a result, the direct bonding at elevated temperatures of these materials to each other to produce segmented leg components is difficult and often results in localized microcracking at interfaces and mechanical failure due to the stresses that arise from CTE mismatch between the various materials. Even in the absence of full mechanical failure, the degraded interfaces can lead to increased electrical and thermal resistances which adversely impact conversion efficiency and power output.

For example, cracking can occur in a segmented p-type thermoelectric leg made of high CTE (e.g. approximately 18 ppm) $Yb_{14}MnSb_{11}$ Zintl material (high temperature segment) bonded to an intermediate CTE (e.g. approximately 13 ppm) $Ce_fFe_{4-x}Co_xSb_{12}$ skutterudite material (low temperature segment) using a direct brazing method on pre-metallized thermoelectric material segments. In one test a large crack has been observed post fabrication in the Zintl segment, presumed to have occurred as a consequence of the bonding process.

In view of the foregoing, there is a need in the art for apparatuses and methods for mechanically compliant interface materials, particularly to accommodate induced stresses from very high temperature gradients, e.g. above 700 K. There is a need for such apparatuses and methods to have high thermal and electrical conductivity. In addition, there is a particular need for such apparatuses and method to operate with Zintl thermoelectric materials such as $Yb_{14}MnSb_{11}$. There is also a need for such apparatuses and methods in Zintl-based thermoelectric devices operating at high temperatures, e.g. around or above 1,000 K and up to 1273 K. There is a need for such apparatuses and methods to operate for such thermoelectric devices in space applications. These and other needs are met by embodiments of the present invention as detailed hereafter.

SUMMARY OF THE INVENTION

A thermoelectric power generation device is disclosed using one or more mechanically compliant and thermally and electrically conductive layers to accommodate high temperature differentials and stresses induced thereby. The compliant material may be nickel foam or nickel graphite composite and is particularly beneficial in high temperature thermoelectric generators employing Zintl thermoelectric materials. The compliant material may be disposed between the thermoelectric segments of the device or between a thermoelectric segment and the hot or cold side interconnect of the device.

A typical embodiment of the invention comprises a thermoelectric device having a thermoelectric material for generating electrical power from heat, an adjacent material thermally and electrically coupled to the thermoelectric material, and a compliant metal layer bonded between the thermoelectric material and the adjacent material. The compliant metal layer comprises a metal having a reduced density structure. Typically, the reduced density structure may be 60% or less of the metal as a solid. In some embodiments, the compliant metal layer may be pressed to adjust thermal and electrical conductivity of the layer prior to bonding between the thermoelectric material and the adjacent material. The compliant metal layer may be bonded by brazing to the thermoelectric material and the adjacent material. The adjacent material may comprise a second thermoelectric material or any other element of the thermoelectric device requiring thermal and electrical coupling, e.g. the electrodes.

In further embodiments of the invention the thermoelectric material may comprise Zintl. In some embodiments, the compliant metal layer may comprise nickel. In this case, the compliant metal layer may comprise a nickel foam or a nickel graphite composite.

In a similar manner, a typical method embodiment of the invention of bonding thermoelectric materials, comprising the steps of bonding a compliant metal layer to a thermoelectric material for generating electrical power from heat, and bonding an adjacent material to the compliant metal layer opposite the thermoelectric material such that the thermoelectric material and the compliant metal layer are thermally and electrically coupled. The compliant metal layer comprises a metal having a reduced density structure. The method embodiment of the invention may be further modified consistent with the apparatus embodiments described herein.

Another embodiment of the invention may comprise a thermoelectric device, including a thermoelectric material means for generating electrical power from heat, an adjacent material thermally and electrically coupled to the thermoelectric material means, and a compliant metal layer means for reducing thermal stresses bonded between the thermoelectric material means and the adjacent material. The compliant metal layer means comprises a metal having a reduced density structure. This embodiment of the invention may be further modified consistent with the apparatus and method embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

As previously mentioned, embodiments of the present invention are directed to forming compliant materials to accommodate thermally induced stresses in thermoelectric materials, particularly Zintl thermoelectric materials such as $Yb_{11}MnSb_{14}$, while still delivering the necessary thermal and electrical conductivity. Generally speaking, embodiments of the invention are directed to using compliant metal composition layers at material interfaces. The compliant metal composition have a structure of reduced density in order to achieve an adequate level of mechanical compliance such that induced thermal stresses in the overall device are alleviated at the interface. A metal, such as nickel, is selected in order to achieve the thermal and electrical conductivity required at the thermoelectric material interfaces in such devices. The reduced density of the metal composition can be achieved through different techniques as will be appreciated by those skilled in the art.

In one example, a the composition may comprise a metal "foam," e.g. a nickel foam. Nickel foam is a known nickelbased material having low density permeable material with numerous applications. A key characteristic of such foams is a very high porosity, e.g. typically 75-95% of the volume may comprise void spaces. Historically, such metallic foams have been employed in a wide variety of applications in heat exchangers, energy absorption, flow diffusion and lightweight optics.

Another suitable compliant metal composition is a nickel graphite composite. In this case, known graphite powder which has been pre-coated with nickel (e.g. 60 weight percent nickel) may be hot pressed (e.g. at 1000 C under 18,000 psi) to form the compliant metal composition. Any other known suitable manufacturing process may also be employed which will yield a solidified low density composition material of the nickel graphite powder may also be used.

2. Compliant Interfacial Materials in Thermoelectric Devices

Figure 1A:
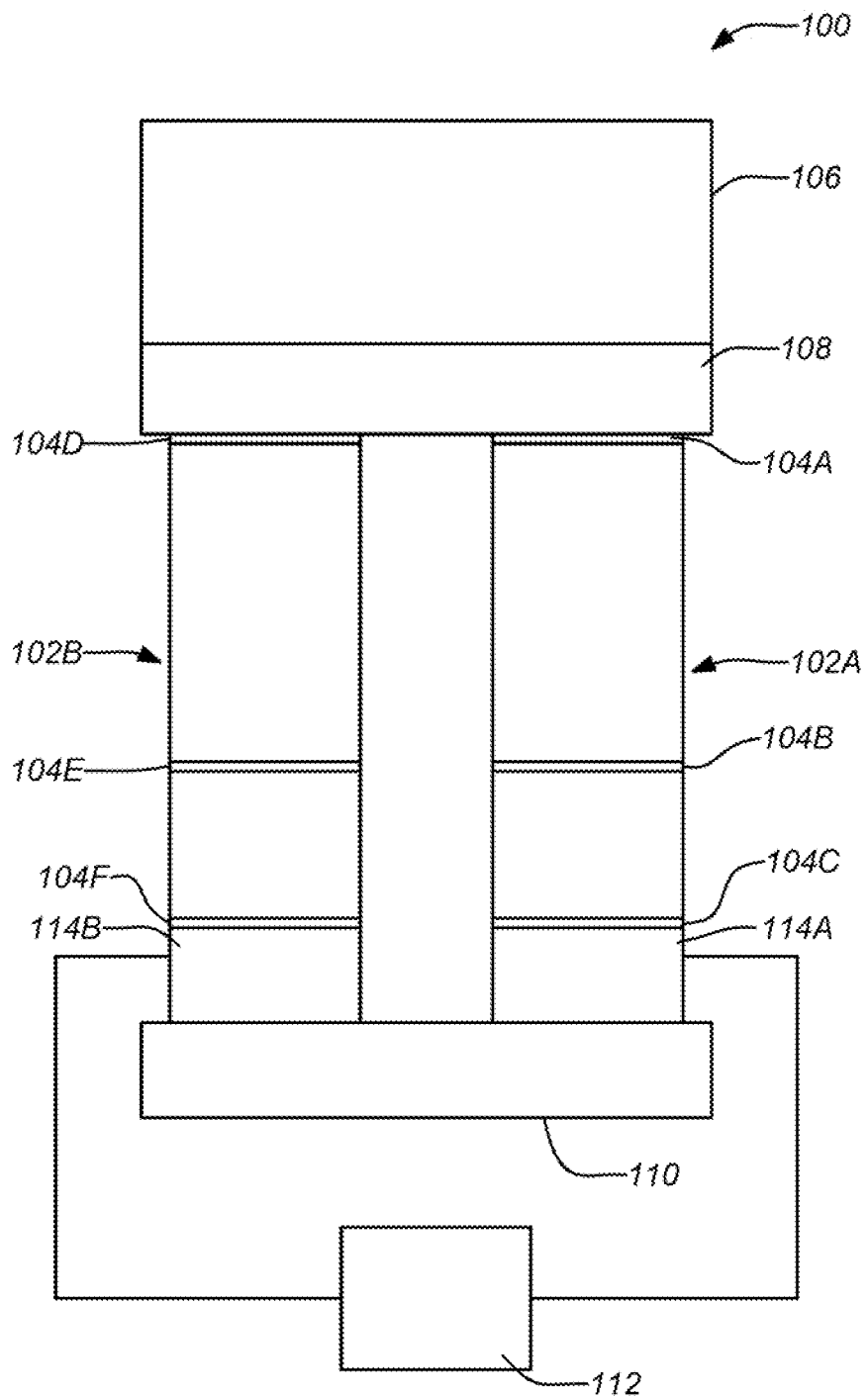
FIG. 1A is a schematic diagram of an exemplary segmented thermoelectric generator employing a thermoelectric material with a compliant metal layer.

FIG. 1A is a schematic diagram of an exemplary segmented thermoelectric generator device 100 employing two thermoelectric material legs 102A, 102B. The thermoelectric device 100 employs a thermoelectric material, such as Zintl, for both thermal and electrical conduction. The thermoelectric material legs 102A, 102B of the thermoelectric device 100 generate electrical power directly from the applied thermal gradient between the heat collector 108 at one end and the cold shoe 110 at the other end. One thermoelectric material leg 102B acts as an n-type material providing excess electrons while the other thermoelectric material leg 102A acts as an p-type material with deficient electrons.

The two thermoelectric material legs 102A, 102B are thermally coupled in parallel between the heat collector 108 and cold shoe 110 but electrically isolated from one another. Heat is provided to the heat collector 108 from a coupled heat source 106, e.g. a decaying radioisotope such as plutonium 238 or any other suitable heat source capable of generating temperatures at or above 1000° C. Representative heat collectors can comprise graphite, nickel, silicon or any other materials which can be bonded to the thermoelectric elements and other elements and which exhibit sufficient thermal conductivity and stability at the operating temperature of the device. The cold shoe 110 at the opposing end may include a radiator for rejecting heat to enhance the temperature differential across the thermoelectric material legs 102A, 102B. Electrical power is yielded from an electrical series connection across the two thermoelectric material legs 102A, 102B at electrodes 114A, 114B. Example electrode materials include copper, nickel and their related alloys. Typically, the electrical power is coupled to a power system 112 which may include a regulator and/or battery subsystems as known in the art.

Typically, a Zintl-based thermoelectric material, e.g. $Yb_{11}MnSb_{14}$, or skutterudite, may be employed for the p-type thermoelectric material leg 102A, while another thermoelectric material, such as silicon germanium, lanthanum telluride or other n-type thermoelectric materials, may be employed for the n-type leg 102B. However, those skilled in the art will appreciate that other combinations of thermoelectric materials may be employed for embodiments of the invention. Furthermore, each thermoelectric material leg 102A, 102B may comprise a combination of thermoelectric materials.

As previously discussed, the temperatures involved in the manufacture and operation of the device 100 can induce high stresses capable of fracturing elements and reducing the efficiency or possibly rendering the device 100 inoperable. Accordingly, embodiments of the invention can reduce or eliminate such thermally induced stresses through the use of one of more mechanically compliant metal layers 104A-104F.

The compliant metal layers 104A-104F may be employed within the device at any interface of a thermoelectric material and another adjacent material which must be both thermally and electrically conductive. Thus, the compliant metal layers 104A-104F may be used within either thermoelectric material leg 102A, 102B (e.g. compliant metal layers 104C, 104F) at the interfaces of the electrodes 114A, 114B or the interfaces of the heat collector 108 (e.g. compliant metal layers 104A, 104D). In addition, because many thermoelectric devices may employ multiple different thermoelectric materials within the legs 102A, 102B, the compliant metal layers 104A-104F may be disposed at the interface between two different thermoelectric materials (e.g. compliant metal layers 104B, 104E) arranged in series within the thermoelectric material legs 102A, 102B.

In order to be properly compliant, the metal layers 104A-104F each comprise a metal having a reduced density structure (compared to the metal as a solid). For example, nickel (or other metals such as copper) may be used in a porous form known as nickel "foam." The metal structure is very porous having a lower density than solid nickel. In some applications the reduced density structure may be 60% or less of the metal (e.g. nickel) as a solid. Another suitable reduced density metal structure may be produced by sintering powders. For example, a nickel graphite composite may be formed from graphite powder which has been pre-coated with nickel (e.g. 60 weight percent nickel) and hot pressed (e.g. at 1000 C under 18,000 psi) to form the compliant metal structure. The lowered density of the metal structure provides the compliance to absorb thermally induced stresses arising from the expansion of the other materials in the device. Bonding of the compliant metal layers 104A-104F may be achieved through diffusion bonding or brazing or any other suitable technique known to provide a conductive joint with the compliant metal material.

It should also be noted that design of particular interfaces using the compliant metal layers may be readily adjusted through a simple cold working process applied to the layers. Recognizing that the density varies inversely with the conductivity (thermal and electrical) for a given low density metal structure, by pressing the compliant material layers, the conductivity may be increased at the cost of some density (i.e. some compliance). In this way, compliant layers may be "tuned" for the optimum balance of properties in a particular application as will be readily appreciated by those skilled in the art.

Figure 1B:
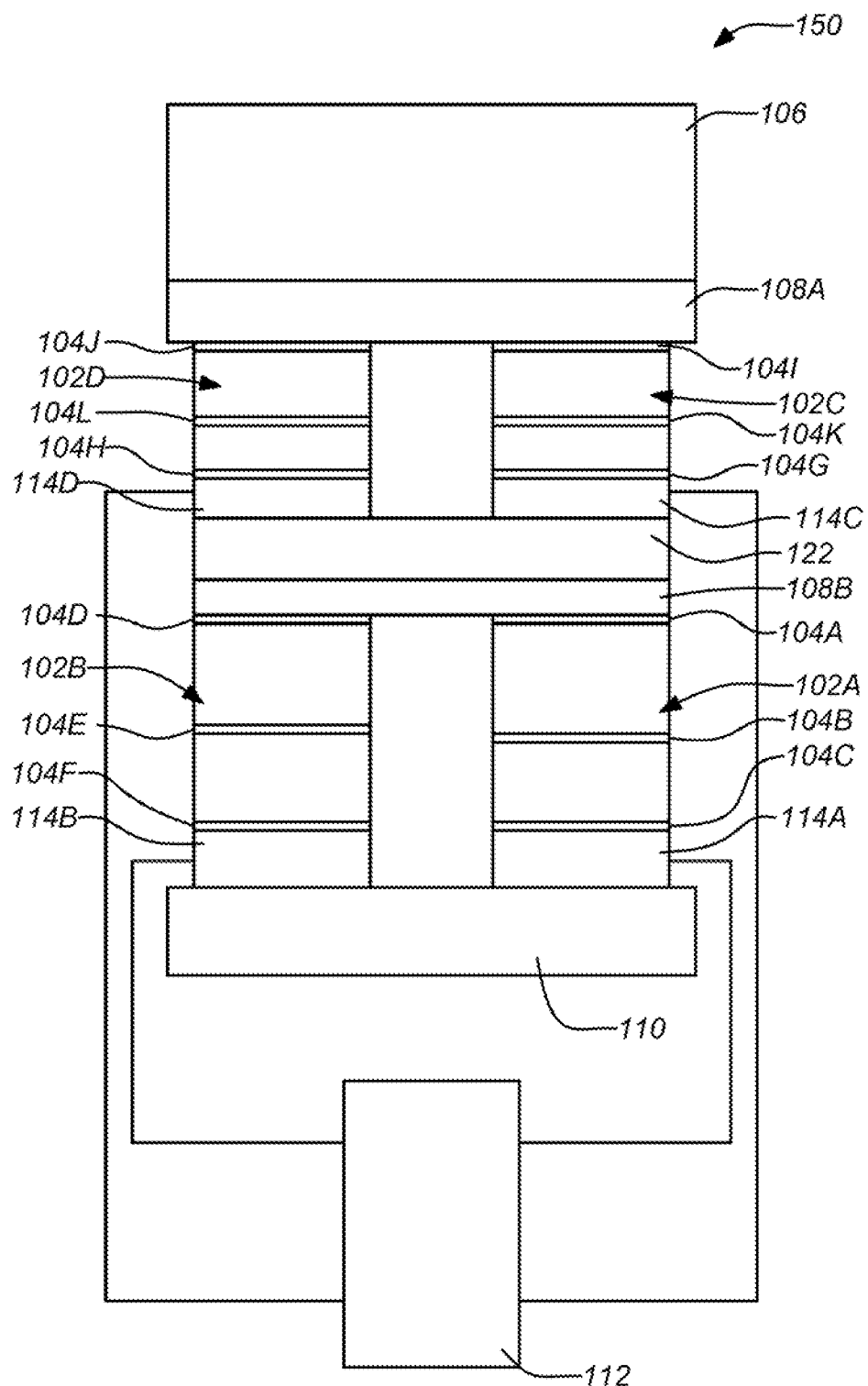
FIG. 1B is a schematic diagram of an exemplary cascaded thermoelectric generator employing a thermoelectric material with a compliant metal layer.

FIG. 1B is a schematic diagram of an exemplary cascaded thermoelectric generator device 150 employing a thermoelectric material with a compliant metal layer. This device 150 includes two stages in series across the applied overall thermal gradient. Each stage essentially operates in the same manner as the single stage device of FIG. 1A and the prior description is generally applicable as will be understood by those skilled in the art. However, the interface between the stages includes an upper electrically non-conductive element 122 to electrically isolate the stages from one another. Both these interface elements are thermally conductive, however. For each stage, the compliant metal layers 104A-104L may be employed between a thermoelectric material and an adjacent material thermally and electrically coupled thereto; e.g. at the electrodes 114A-114D (compliant metal layers 104C, 104F, 104G, 104H), at the heater collectors 108A, 108B (compliant metal layers 104A, 104D, 104I, 104J), and between different thermoelectric materials with the legs 102A-102D (compliant metal layers 104B, 104E, 104K, 104L). Electrical power is coupled to a power system 112 (which may be two separate systems for each stage) from the electrodes 114A-114D which may include a regulator and/or battery subsystems as known in the art.

Figure 1C:
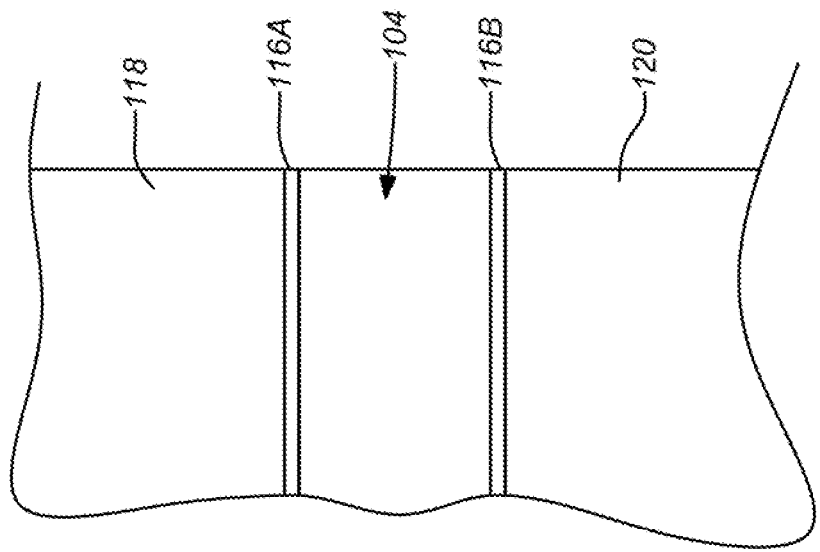
FIG. 1C is an example enlarged view of a compliant metal layer between a thermoelectric material and an adjacent material.

FIG. 1C is an example enlarged view of a compliant metal layer 104 between a thermoelectric material 118 and an adjacent material 120. Note the thermoelectric material 118 and adjacent material 120 may be any of the applicable elements previously described—the upper and lower positions as shown may be switched. Bonding between the compliant metal layer 104 and both the adjacent material 120 and the thermoelectric material 118 may be achieved through by brazing leaving a thin layer 116A, 116B of brazing material therebetween to provide a conductive joint between the compliant metal layer 104 and the other materials. The brazing material may be Cusil-ABA (comprising silver, titanium, and copper), for example, or any other suitable composition.

It should be noted that the thermoelectric devices 100, 150 depicted in FIGS. 1A & 1B are not to scale and present only example thermoelectric power generation devices. The thermoelectric devices 100, 150 are just example configurations of embodiments of the invention. Those skilled in the art will appreciate that the general configurations of previously developed thermoelectric power generation devices, e.g. SiGe and other RTGs, as well as newer Zintl thermoelectric devices may or be employed with compliant metal layers. In addition, the thermoelectric material legs 102A, 102B may also include other materials, e.g. to facilitate electrical connection to the power system 112 and electrical isolation, e.g. graphite barriers may be employed in the element stack. The heating element 106 need not be directly adjacent to the heat collector 108 but may only be radiatively coupled to the heat collector 108 instead.

It should also be noted that embodiments of the invention are not restricted to thermoelectric power generation devices, but may be applied to any application (e.g., possibly thermoelectric coolers and heaters as well) employing a thermoelectric material which may undergo high thermally induced stresses. In addition, embodiments of the invention are not restricted to space applications in a vacuum environment. Embodiments of the invention may be employed with other environments surrounding the thermoelectric material. For example, some applications may utilize an Ar environment surrounding the thermoelectric material.

3. Forming Compliant Metal Interfaces in Thermoelectric Device

Embodiments of the invention also encompass a method of forming compliant metal interfaces in a thermoelectric device. Detailed finite element analyses of thermally induced mechanical stress during thermoelectric component fabrication and segmented leg assembly can indicate that thin layers of low modulus porous metal foams can yield large reductions in tensile and/or compressive stresses at interfaces while maintaining acceptable electrical and thermal conductance characteristics. Free-standing segmented thermoelectric legs may be fabricated by bonding a thin nickel foam layer between the high temperature, high CTE Zintl segment and a lower temperature, lower CTE skutterudite segments. The elements may be brazed using a layer of Cusil-ABA braze in-between the nickel foam and the metallized Zintl and skutterudite segments. For bonding, the segments may be heated to 630° C. and held for 20 minutes with approximately 50 psi of compressive load under high vacuum. This bonding technique may be readily applied to other thermoelectric materials into segmented thermoelectric material legs as will be appreciated by those skilled in the art.

Alternately, graphite powders that have been pre-coated with 60 weight percent nickel (e.g. from Novamet Specialty Products Corp.) may be hot pressed (at 1000° C. under 18000 psi) to form compliant metal layers from the nickel-graphite composite material. A free standing thermoelectric segmented leg may be fabricated by bonding the compliant pad layer between the high temperature (p-Zintl) and low temperature (p-SKD) thermoelectric segments brazed using a layer of Cusil-ABA braze in-between the nickel-graphite composite and the metallized Zintl and skutterudite segments The segments may be heated to 630° C. and held for 20 minutes with approximately 50 psi of compressive load under high vacuum. This bonding technique may be readily applied to other thermoelectric materials into segmented thermoelectric material legs as will be appreciated by those skilled in the art.

Figure 2:
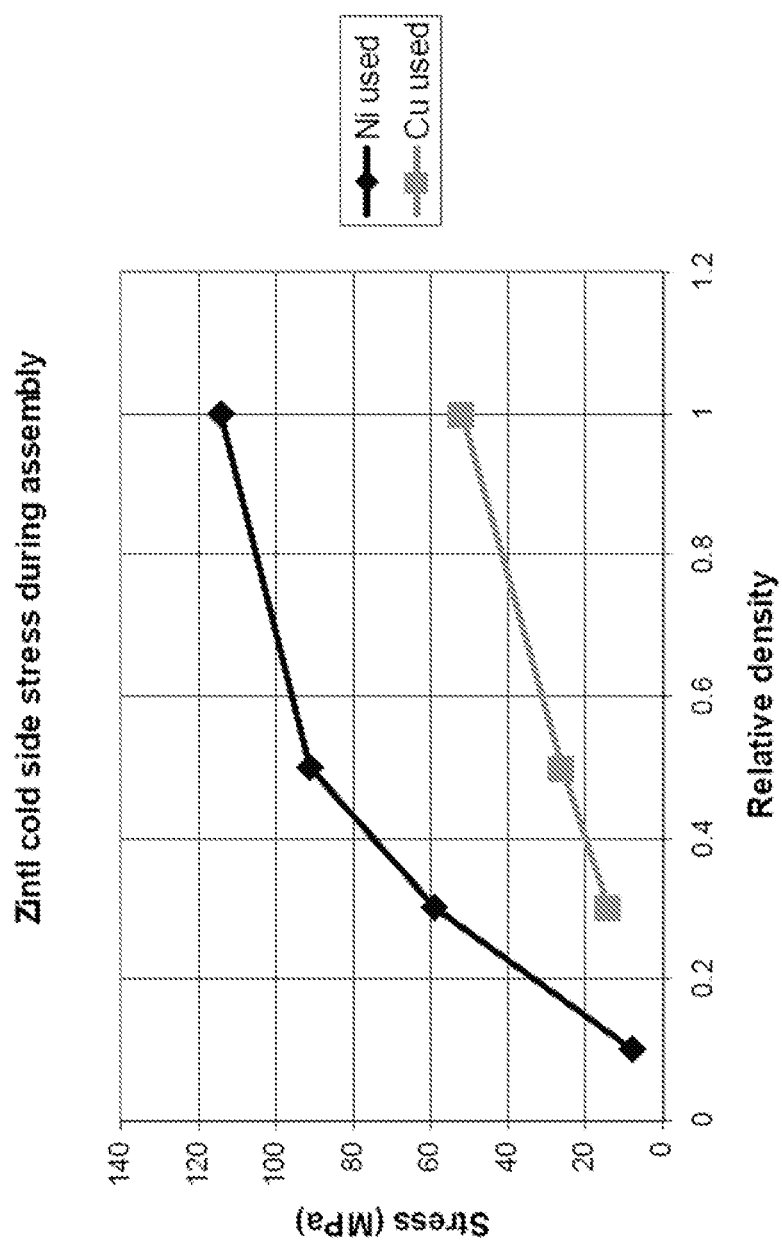
FIG. 2 is plot of example Zintl segment interfacial stresses (as part of a segmented Zintl/skutterudite leg) for various grades of porous Ni and Cu foams.

FIG. 2 is plot of example Zintl segment interfacial stresses (as part of a segmented Zintl/skutterudite leg) for various grades of porous Ni and Cu foams. As shown by the plots appreciable benefits arise at relative densities below 60%, with large reductions in tensile stress predicted for highly porous foams (i.e. less than 30% of relative density). It is expected that similar plots may be readily developed for other suitable materials such as nickel graphite composite.

Figure 3:
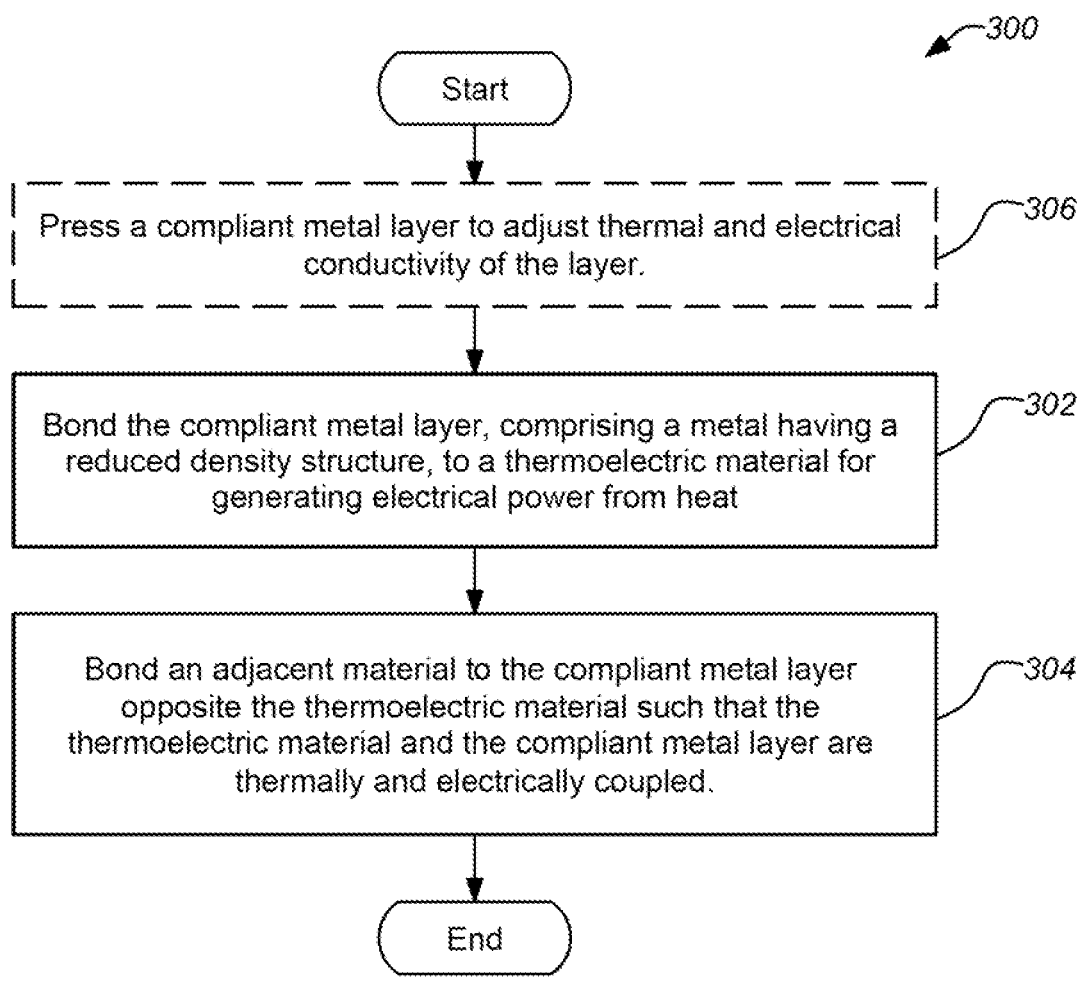
FIG. 3 is a flowchart of an exemplary method of forming a compliant metal layer on a thermoelectric material in a thermoelectric device.

FIG. 3 is a flowchart of an exemplary method 300 of forming a compliant metal layer on a thermoelectric material in a thermoelectric device. The method 300 begins with an operation 302 of bonding a compliant metal layer, comprising a metal having a reduced density structure, to a thermoelectric material for generating electrical power from heat. In operation 304, an adjacent material is bonded to the compliant metal layer opposite the thermoelectric material such that the thermoelectric material and the compliant metal layer are thermally and electrically coupled. The method 300 may be further modified to include the optional operation 306 of pressing the compliant metal layer to adjust thermal and electrical conductivity of the layer prior to bonding between the thermoelectric material and the adjacent material.

Embodiments of the invention comprise insertion of a high electrical and thermal conductivity mechanically compliant nickel foam or nickel-graphite composite layer between the low and high temperature segments to relieve thermomechanical stresses during device fabrication and operation. These materials can be used as a stress relieving layer between the thermoelectric segments and/or between a thermoelectric segment and a hot or cold side interconnect material. (The nickel-graphite material can also be used as a compliant hot shoe material.) A comparison of the electrical resistivity, coefficient of thermal expansion (CTE) and Young's modulus is shown below for nickel, nickel foam (NTR#48519) and the nickel-graphite composite.

TABLE 1

Relevant property comparison for Ni, Ni foam and Ni—C composite materials

| Property | Nickel (100% dense) | Nickel foam (90% porosity) | Nickel (60%)-graphite Composite |
|---|---|---|---|
| Electrical resistivity (Ohm-m) | 6.85E−8 | 2E−6 | 3E−7 |

TABLE 1-continued

Relevant property comparison for Ni, Ni foam and Ni—C composite materials

| Property | Nickel (100% dense) | Nickel foam (90% porosity) | Nickel (60%)-graphite Composite |
|---|---|---|---|
| Average CTE (ppm/° C.) (RT-500° C.) | 16.6 | 16.6 (estimated) | 14.4 |
| Young's Modulus (Gpa) | 207 | 2 (estimated) | 4-35 |

As described, compliant metal layers for thermoelectric devices may be formed from low elastic modulus metal foam, a porous material that reduces the thermo-mechanical stresses encountered in the construction of high efficiency, high temperature thermoelectric device. In addition, embodiments of the invention may also employ the use of a composite material that reduces the thermo-mechanical stresses encountered in the construction of high efficiency, high temperature thermoelectric devices. In use, the metal foam or composite composition or and thus CTE can be adjusted to minimize mismatch with the parts to be joined, and can easily be brazed to the metallized surfaces of the thermoelectric materials segments, while maintaining the desired electrical and thermal properties essential for efficient device operation. The modulus, stiffness, electrical and thermal conductances of the materials can be controlled through the type and amount of porosity, its chemical composition and pressing (cold working) to fine tune. This improvement offers a versatile technique to joining various thermoelectric materials into segmented device architectures and maximizes energy conversion efficiency.

This concludes the description including the preferred embodiments of the present invention. The foregoing description including the preferred embodiment of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A thermoelectric device, comprising:
a thermoelectric material for generating electrical power from heat;
an adjacent material thermally and electrically coupled to the thermoelectric material; and
a compliant metal layer bonded between the thermoelectric material and the adjacent material;
wherein the compliant metal layer comprises nickel with less than 50% of the nickel as a solid.

2. The thermoelectric device of claim 1, wherein the compliant metal layer comprises cold worked material to adjust thermal and electrical conductivity of the layer.

3. The thermoelectric device of claim 1, wherein bonds between the compliant metal layer and the thermoelectric material and the adjacent material comprises brazed bonds.

4. The thermoelectric device of claim 1, wherein the adjacent material comprises a second thermoelectric material.

5. The thermoelectric device of claim 1, wherein the thermoelectric material comprises Zintl.

6. The thermoelectric device of claim 1, wherein the compliant metal layer comprises nickel graphite composite.

7. A thermoelectric device, comprising:
a thermoelectric material means for generating electrical power from heat;
an adjacent material means for thermally and electrically coupling to the thermoelectric material means; and
a compliant metal layer for reducing thermal stresses bonded between the thermoelectric material means and the adjacent material means;
wherein the compliant metal layer comprises nickel graphite composite with less than 60% of the nickel as a solid.

8. A thermoelectric device, comprising:
a thermoelectric material for generating electrical power from heat;
an adjacent material thermally and electrically coupled to the thermoelectric material; and
a compliant metal layer bonded between the thermoelectric material and the adjacent material;
wherein the compliant metal layer comprises copper with less than 60% of the copper as a solid.

9. The thermoelectric device of claim 8, wherein the compliant metal layer comprises cold worked material to adjust thermal and electrical conductivity of the layer.

10. The thermoelectric device of claim 8, wherein bonds between the compliant metal layer and the thermoelectric material and the adjacent material comprises brazed bonds.

11. The thermoelectric device of claim 8, wherein the adjacent material comprises a second thermoelectric material.

12. The thermoelectric device of claim 8, wherein the thermoelectric material comprises Zintl.

13. The thermoelectric device of claim 1, wherein the compliant metal layer comprises less than 30% of the nickel as a solid.

14. The thermoelectric device of claim 7, wherein the compliant metal layer comprises less than 50% of the nickel as a solid.

15. The thermoelectric device of claim 7, wherein the compliant metal layer comprises less than 30% of the nickel as a solid.

16. The thermoelectric device of claim 8, wherein the compliant metal layer comprises less than 50% of the copper as a solid.

17. The thermoelectric device of claim 8, wherein the compliant metal layer comprises less than 30% of the coper as a solid.

* * * * *